(12) United States Patent
Shi et al.

(10) Patent No.: US 9,219,194 B2
(45) Date of Patent: Dec. 22, 2015

(54) FLIP-CHIP LIGHT EMITTING DIODE AND FABRICATION METHOD

(71) Applicant: XIAMEN SANAN OPTOELECTRONICS TECHNOLOGY CO., LTD., Xiamen (CN)

(72) Inventors: Junpeng Shi, Xiamen (CN); Jiali Zhuo, Xiamen (CN); Lixun Yang, Xiamen (CN); Shaohua Huang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/588,087

(22) Filed: Dec. 31, 2014

(65) Prior Publication Data

US 2015/0108514 A1    Apr. 23, 2015

Related U.S. Application Data

(63) Continuation of application No. PCT/CN2013/087044, filed on Nov. 13, 2013.

(30) Foreign Application Priority Data

Nov. 15, 2012    (CN) .......................... 2012 1 0459767

(51) Int. Cl.
*H01L 29/18* (2006.01)
*H01L 33/14* (2010.01)
*H01L 33/38* (2010.01)
*H01L 33/00* (2010.01)
*H01L 33/46* (2010.01)
*H01L 33/40* (2010.01)

(52) U.S. Cl.
CPC .......... *H01L 33/145* (2013.01); *H01L 33/0079* (2013.01); *H01L 33/385* (2013.01); *H01L 33/46* (2013.01); *H01L 33/405* (2013.01); *H01L 2933/0016* (2013.01); *H01L 2933/0025* (2013.01)

(58) Field of Classification Search
CPC . H01L 33/145; H01L 33/0079; H01L 33/385; H01L 33/46; H01L 33/405
USPC ...................................... 257/88, 98
See application file for complete search history.

(56) References Cited

U.S. PATENT DOCUMENTS

| | | | |
|---|---|---|---|
| 6,281,526 B1* | 8/2001 | Nitta | H01L 33/40 257/103 |
| 2008/0237620 A1* | 10/2008 | Shiue | H01L 33/405 257/98 |
| 2010/0208763 A1* | 8/2010 | Engl | H01L 33/405 372/46.01 |
| 2011/0175131 A1* | 7/2011 | Seo | H01L 33/0079 257/98 |

* cited by examiner

*Primary Examiner* — Khiem D Nguyen
(74) *Attorney, Agent, or Firm* — Syncoda LLC; Feng Ma

(57) ABSTRACT

A flip-chip LED includes a substrate, having a surface with a p-region metal portion and an n-region metal portion separated from each other; a p-type epitaxial layer, an active layer and an n-type epitaxial layer successively laminated on the substrate; a reflection layer between the substrate and the p-type epitaxial layer; a current blocking layer between the reflection layer and the p-type epitaxial layer and positioned to prevent the current from concentrating on the edge of the LED; an insulating protection layer cladding the LED side wall and exposing part of the side wall of the n-type epitaxial layer; a P electrode connecting the metal reflection layer and the p-region metal portion of the substrate; and an N electrode connecting the side wall of the n-type epitaxial layer and n-region metal portion of the substrate.

13 Claims, 7 Drawing Sheets

FLIP-CHIP LIGHT EMITTING DIODE AND FABRICATION METHOD

CROSS-REFERENCE TO RELATED APPLICATIONS

The present application is a continuation of, and claims priority to, PCT/CN2013/087044 filed on Nov. 13, 2013, which claims priority to Chinese Patent Application No. CN201210459767.1 filed on Nov. 15, 2012. The disclosures of these applications are hereby incorporated by reference in their entirety.

BACKGROUND

In recent years, developments of GaN-based LED have drawn extensive attention across the world. It has such inspiring advantages as over 50,000 hours service life, over 100 lm/W light effect and environmental protection. Many governments are vigorously promoting applications of the LEDs and propose to successively cancel usage of the incandescent lamps. However, to replace the incandescent lamps, the LEDs are restricted to such applications as general lighting and outdoor lighting due to poor luminance performance.

To improve luminous efficiency is an important approach to increase luminance Deficiencies such as electrode light blocking and current blocking of standard chips have restricted luminous efficiency improvement. Therefore, vertical-structure and flip-chip structures are widely applied. The flip-chip structure has the electrode on the bottom and therefore avoids the metal electrode's blocking and absorption as the light is emitted upways. However, in prior art, fabricating the n electrode of flip-chip structure requires to etching part of the p-type layer and the active layer, and to exposing the n-type layer. Then, fabricate the n-type electrode on the n-type layer. Etching part of the p-type layer and the active layer loses the active layer area and influences luminous efficiency improvement. In addition, it restricts effective application of light emitted from the LED chip side wall.

SUMMARY

The present disclosure aims at solving the above deficiencies of the flip-chip LED in prior art and improving the luminous efficiency. for example, in a fabrication method, the flip-chip LED does not require etching the active layer, and thus effectively makes use of the area of the active layer. The side wall electrode will not block the light emission, thereby improving the luminous efficiency.

The technical scheme to solve the problems in prior art are that: an LED in which the n-type electrode is on the epitaxial side wall in combination with the current blocking layer, specifically comprising a substrate, having a p-region metal portion and an n-region metal portion on the surface, which are separately from each other; a p-type epitaxial layer, an active layer and an n-type epitaxial layer successively laminated on the substrate; a reflection layer, between the substrate and the p-type epitaxial layer; a current blocking layer between the reflection layer and the p-type epitaxial layer, the position of which prevents the current from concentrating on the edge of the LED; an insulating protection layer, cladding the LED side wall and exposing part of the side wall of the n-type epitaxial layer; a P electrode, which connects the metal reflection layer and the p-region metal portion of the substrate; and an N electrode, which connects the side wall of the n-type epitaxial layer and n-region metal portion of the substrate.

Preferably, the N electrode contacts with the side wall of the n-type epitaxial layer and revolves around the LED.

Preferably, the insulating protection layer clads the n-type epitaxial layer and the side wall of the active layer surface and part of the side wall of the n-type epitaxial layer, thus avoiding direct contact of the n electrode and the active layer.

In some embodiments, the reflection layer is a metal reflection layer and the current blocking layer appears band-shaped distribution along the reflection layer.

In some embodiments, the LED structure also comprises a current expansion layer, which contacts the p-type epitaxial layer and the p electrode at the same time, and the reflection layer is a DBR layer, covering on the current expansion layer. The current blocking layer appears band-shaped distribution along the current expansion layer edge.

In some embodiments, the insulating protection layer is a DBR layer.

In the above LED fabricating method, the process steps comprise: 1) providing a growth substrate and successively forming an n-type epitaxial layer, an active layer and a p-type epitaxial layer over the growth substrate via epitaxial growth; 2) successively forming a current blocking layer and a reflection layer over the p-type epitaxial layer; 3) fabricating a p electrode and forming grains through splitting; 4) providing a substrate, the surface of which has electrode patterns divided into a p-region metal portion and an n-region metal portion, which are separated from each other. Bonding the grain on the substrate to connect the p electrode with the p-region metal portion of the substrate; 5) removing the growth substrate; 6) fabricating an insulating protection layer on the LED side wall and etching the insulating protection layer to make it expose part of the side wall of the n-type epitaxial layer; 7) fabricating an n electrode, which connects the side wall of the n-type epitaxial layer and the n-region metal portion of the substrate; and 8) obtaining flip-chip LED element through splitting.

In some embodiments, the reflection layer formed in Step 2) is a metal reflection layer and the current blocking layer appears band-shaped distribution along the reflection layer.

In some embodiments, Step 2) also comprises: forming a current expansion layer, which contacts the p-type epitaxial layer and the p electrode at the same time, and the reflection layer is a DBR layer, covering on the current expansion layer. The current blocking layer appears band-shaped distribution along the current expansion layer edge.

Preferably, in Step 4), the electrode patterns on the substrate are periodic. After film expansion, the grains are mounted entirely or one by one; in Step 6), the etching rate of the insulating protection layer of the side wall is less than 0.3 µm/min to accurately control the etching depth and to ensure that the side wall of the n-type epitaxial layer adjacent to the active layer is still covered by the insulating protection layer after etching; and in Step 7) the formed N electrode contacts with the side wall of the n-type epitaxial layer and revolves the LED.

In the present disclosure, the n electrode is on the LED side wall, and does not require to etching part of the active layer to fabricate the n electrode in comparison to the prior art, thus improving the luminous efficiency as no luminous area is lost and overcoming the electrode light blocking defect in comparison to the vertical structure. In addition, design of the current blocking layer prevents the current from concentrating on the LED edge.

101, 201: substrate;
1011, 2011: n– region of the metal-coated electrode portion on the substrate;
1012, 2012: insulation portion of the substrate;
1013, 2013: p– region of the metal-coated electrode portion on the substrate;
1014, 2014: bottom thermal conductive layer on the substrate;
102, 202: p electrode;
103: insulating protection layer;
104: metal reflection layer;
105, 205: current blocking layer;
106, 206: p-type epitaxial layer;
107, 207: active layer;
108, 208: n-type epitaxial layer;
109, 209: insulating protection layer on the side wall;
110, 210: n electrode;
203: DBR layer;
204: current expansion layer ITO;
301 sapphire grown substrate;
302 epitaxial buffer layer.

DETAILED DESCRIPTION

References will be made to the following drawings to give clear and intuitive description of the LED structure in which the n electrode is on the side wall disclosed in the present disclosure. It is to be understood that the following descriptions are explanatory only, and are not restrictive of the protection scope of the disclosure. The specific protection scope is subject to the Specification. The following drawings are only for intuitive descriptions of the present disclosure but not subject to strict scale.

The following embodiments disclose a flip-chip LED, the n-type electrode of which is on the epitaxial side wall in combination with the current blocking layer, thus improving the luminous efficiency of the flip-chip LED as no luminous area is lost. The specific structure comprises: a substrate with electrode patterns, a light-emitting epitaxial layer comprising a p-type epitaxial layer, an active layer and an n-type epitaxial layer, a reflection layer, a current blocking layer, a side wall insulating protection layer, a P electrode and an N electrode. Wherein, the current blocking layer, in general, locates in the peripheral region of the chip in relation to the positions of the n electrode and the current expansion layer at one end of the p-type epitaxial layer. Detailed description will be given to the realization of the present disclosure in combination with the embodiments and drawings.

Embodiment 1

Figure 1:
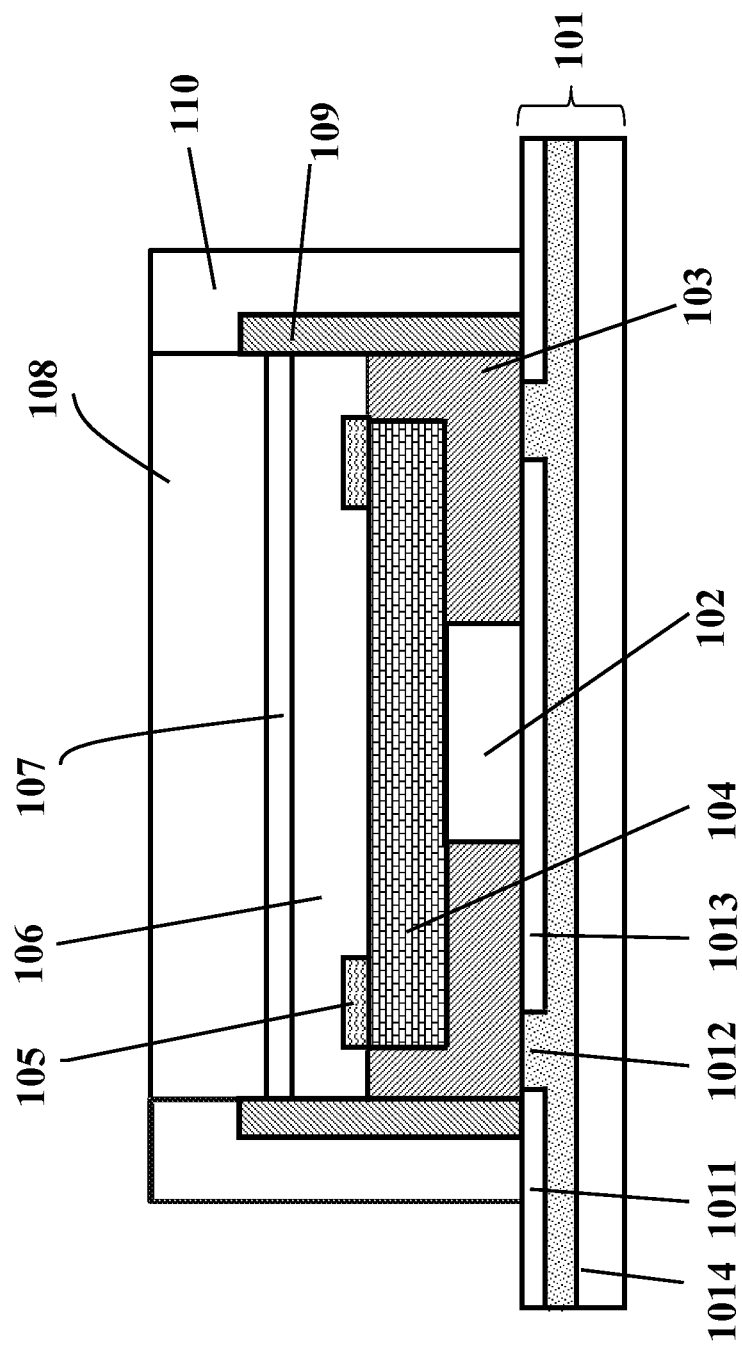
FIG. 1 is a schematic cross section of an LED according to some embodiments.
Figure 2:
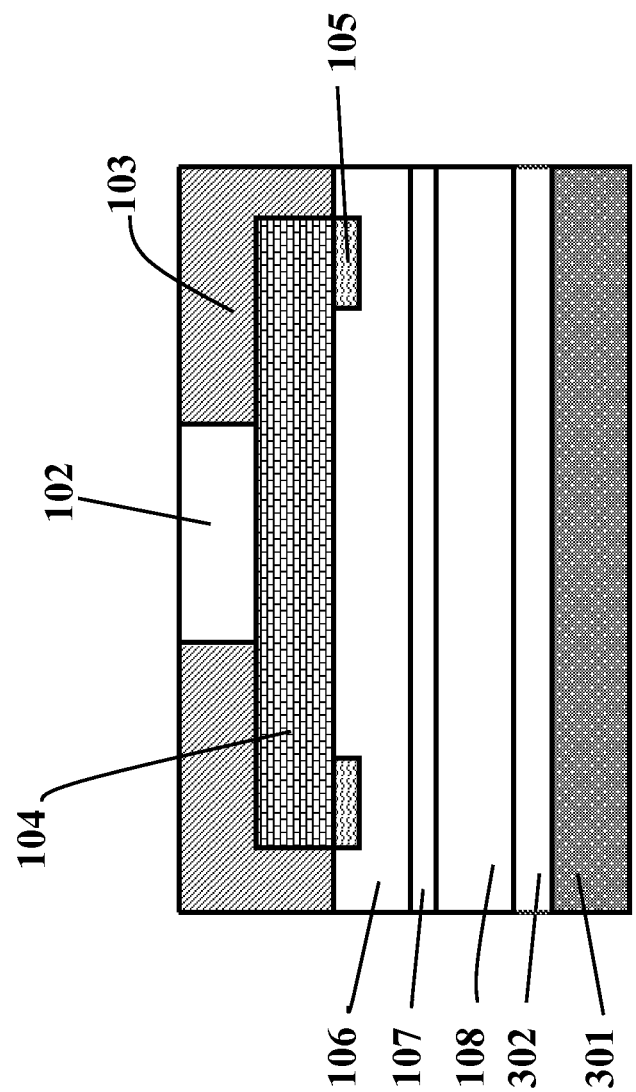
FIG. 2 illustrates a first step an LED fabricating process according to some embodiments.

The present embodiment discloses an LED in which the n electrode is on the side wall, as shown in FIG. 1, specifically comprising: a substrate 101, on which are a p electrode 102, a metal reflection layer 104, a light-emitting epitaxial laminated layer (comprising a p-type layer 106, an active layer 107 and an n-type layer 108), an insulating protection layer 109 on the side wall, and an n electrode 110 connecting the n-type layer 108 and the n region 1011 of the substrate. As shown in FIG. 2, the substrate 101 is characterized in that the surface is coated with periodically arranged metal blocks, and the central space d of the metal block is larger than the grain size. The interior portion of the metal block is separated into a p region 1013 and an n region 1011 by an insulation material 1012. The N electrode 110 clads the chip side wall for a cycle to make the current evenly reject into the epitaxial layer portion of the grain. A current blocking layer 105 is fabricated between the metal reflection layer 104 and the p-type epitaxial layer 106, which has a band-shaped distribution (preferably a closed ring shape) along the reflection layer edge to prevent too much current from concentrating on the LED edge. An insulation layer 103 clads around the P-type electrode 102 and the metal reflection layer 104 to ensure mechanical stability of the LED on the substrate 101 during flip-chip fabrication and further side wall processes. The LED is also characterized in that the side wall insulation layer 109 extends to part of the side wall of the n-type epitaxial layer to prevent the n electrode 110 from contacting the active layer 107.

The embodiment also discloses a fabricating method for the LED, mainly comprising epitaxial growth process, chip fabricating process and chip bonding process, which will be described in detail below.

First, grow a buffer layer 302 and a light-emitting epitaxial laminated layer, comprising an n-type epitaxial layer 108, an active layer 107 and a p-type epitaxial layer 106 over the sapphire growth substrate 301.

Next, form a current blocking layer pattern on the surface of the p-type epitaxial layer 106 via a photomask. After dry etching, grow an insulation layer to form a current blocking layer 105. The insulation layer applied by the current blocking layer 105 can be $Si_3N_4$, $SiO_2$, SiON or other insulation material. Another method to form the current blocking layer is to directly roughen the surface via dry etching or to directly inject certain ions through ion injection method to increase the resistance.

Next, evaporate the metal reflection layer 104, which can be Ag, Al, Au material or any of their combinations. In this step, the edge of the metal reflection layer 104 overlaps with the edge of the current blocking layer 105 or at the inside part of the current blocking layer 105.

Next, grow an insulating protection layer 103 over the metal reflection layer 104 and expose the surface of the metal reflection layer 104 through photoetching and etching to evaporate the p electrode 102.

Figure 3:
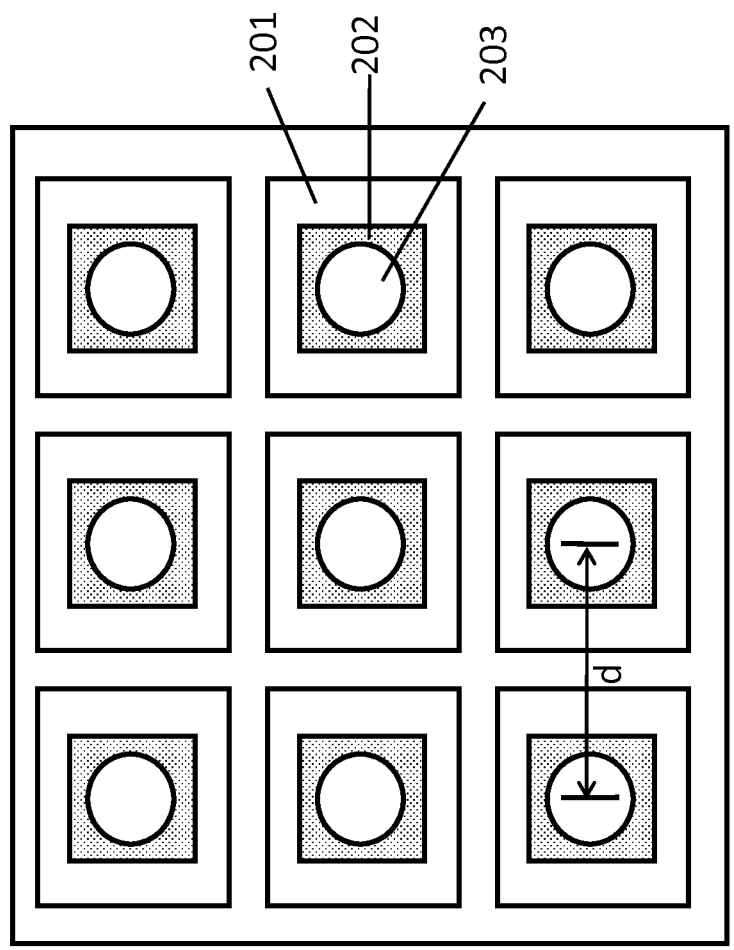
FIG. 3 illustrates a second step.

Next, fabricate a p electrode and split the wafer to form individual grain, the side section view of which is shown in FIG. 3.

Figure 4:
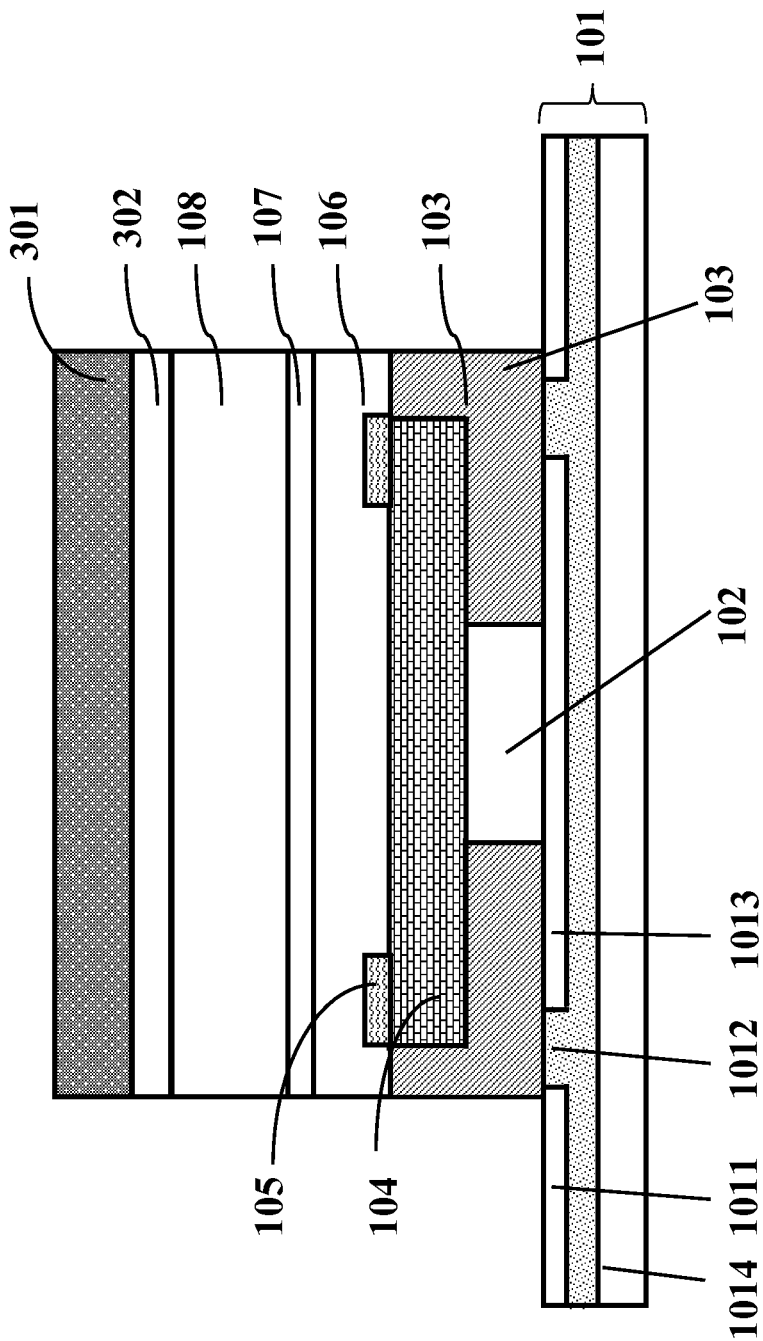
FIG. 4 illustrates a third step.

Next, downward bond the p electrode on the substrate 101 via flip chip bonding, as shown in FIG. 4. The p electrode 102 is to be bonded with the p region 1013 of the substrate. Wherein, refer to FIG. 2 for the substrate 101, the electrode patterns of which are periodically distributed. After film expansion, the grains can be mounted entirely or one by one.

Next, remove the sapphire growth substrate 301 as shown in FIG. 4 via laser lift-off and remove the buffer layer 302 via dry etching.

Next, grow an insulating protection layer 109 on the side wall of each grain via CVD and etch part of the side wall insulation layer 109 to expose the upper part of the n-type layer side wall. The etching rate is less than 0.3 μm/min to accurately control the etching thickness. In this embodiment, the etching rate is 0.1 μm/min. The side wall insulating protection layer 109 can be a DBR layer so as to further improve the luminous efficiency.

Next, grow an n electrode 110 via e-beam evaporation to contact the n-type epitaxial layer with the n electrode of the substrate. The n electrode material can be Ag, Al, Au, Cr, Pt, Cu and metallic oxide and their combination. However, it is not limited to these types of materials.

Figure 5:
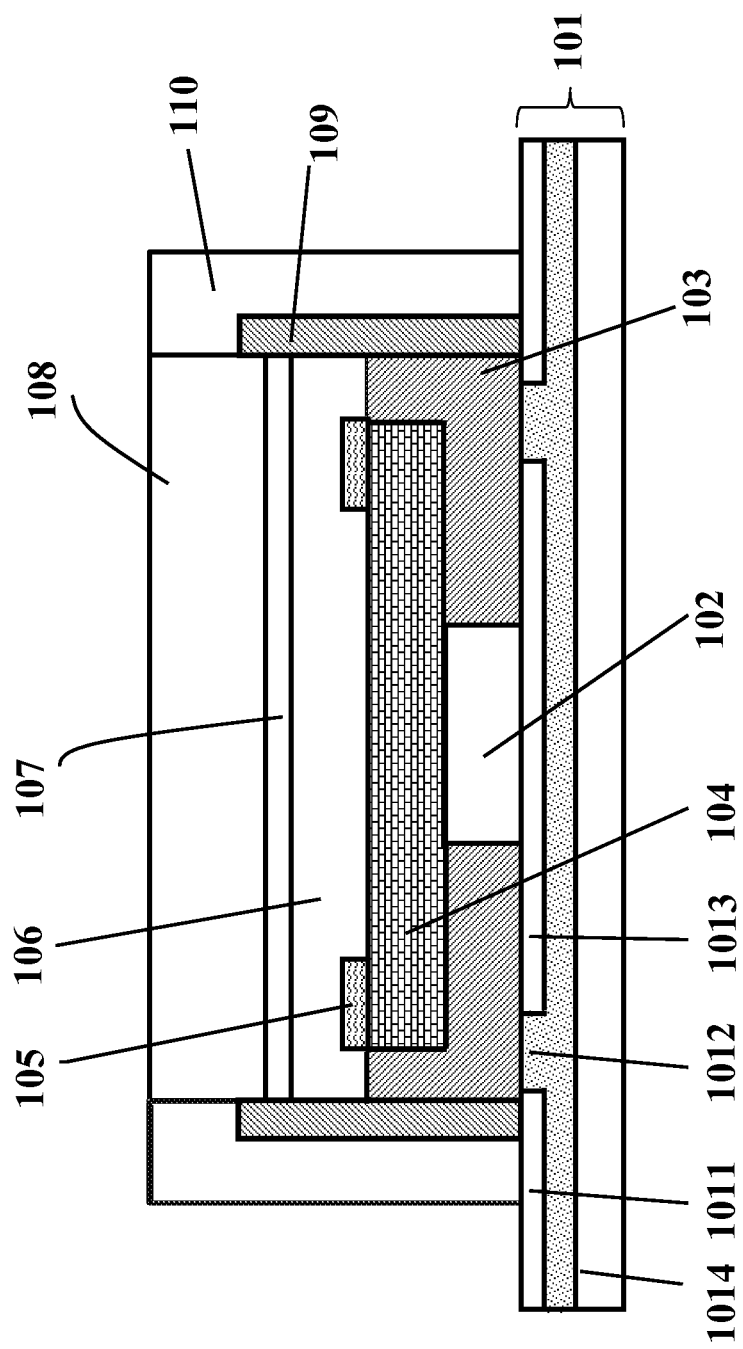
FIG. 5 illustrates a fourth step.

Last, cleaving to obtain a flip-chip LED grain, the structure profile of which is shown in FIG. 5.

Embodiment 2

Figure 6:
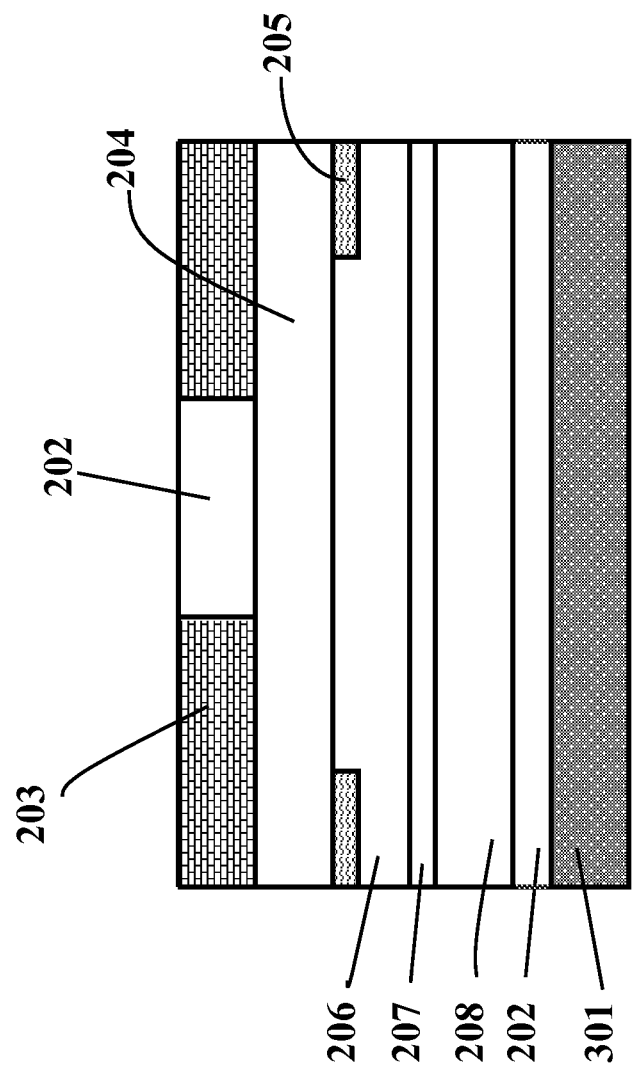
FIG. 6 illustrates a cross-sectional view of an LED according to some other embodiments.
Figure 7:
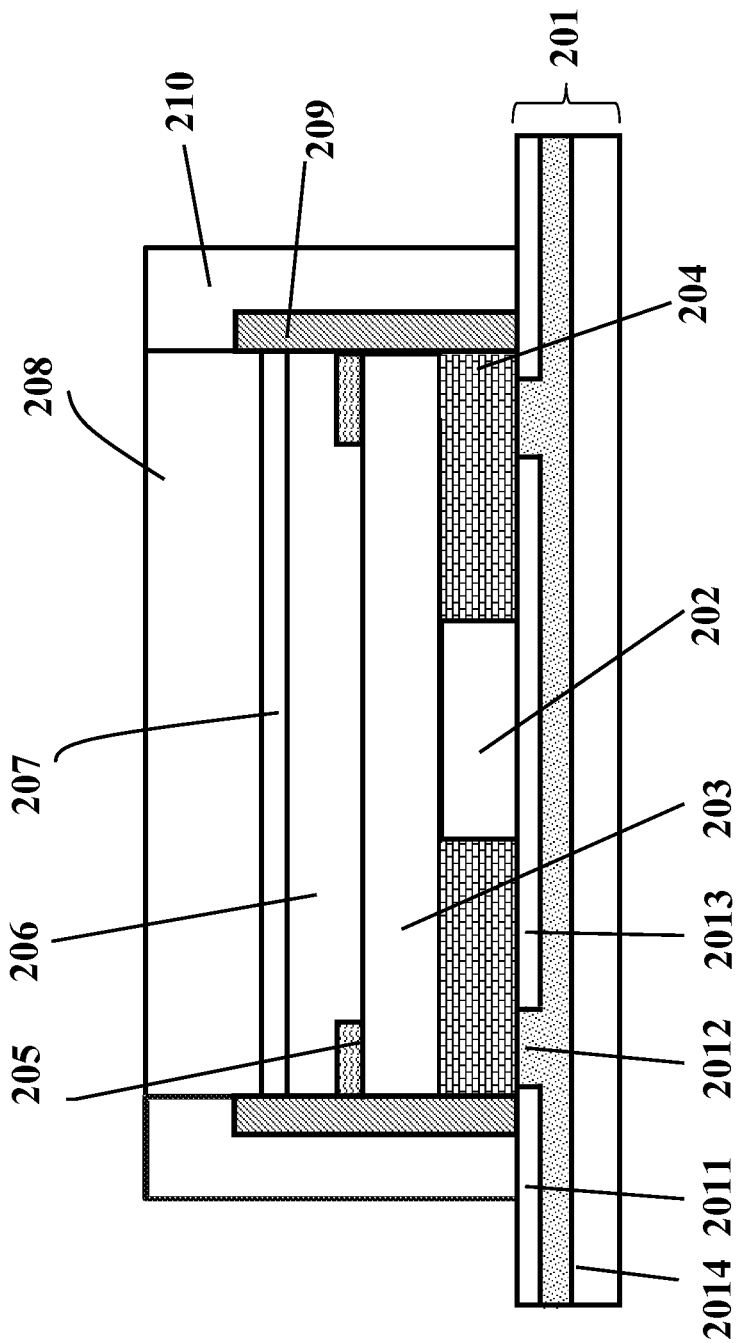
FIG. 7 is another cross-sectional view.

This embodiment adopts the DBR and transparent oxide ITO as the reflection layer and the current expansion layer respectively. Refer to FIG. 6 and FIG. 7 for the structure. The current expansion layer 204 contacts with the p-type epitaxial layer 206 and the p electrode 202. The DBR layer 203 covers on the current expansion layer 204 and the current blocking layer 205 appears band-shaped distribution along the current expansion layer. The fabricating process includes the followings: grow a buffer layer 302 and a light-emitting laminated layer (comprising an n-type epitaxial layer 208, an active layer 207 and a p-type epitaxial layer 206) on the substrate 301 via epitaxial growth. Next, form a current blocking layer 205. Next, grow a transparent oxide over the p-type epitaxial layer as the current expansion layer 204, over which, grow a DBR layer 203.

Fabricate electrode patterns via photoetching and etching. Evaporate the p electrode 202. Cleave the wafer to form individual grain (LED element), the side section view of which is shown in FIG. 6. Next, proceed to processes with reference to the methods in Embodiment 1. FIG. 7 is another cross-sectional view.

In this embodiment, the DBR layer is the reflection layer. On the one hand, it serves as the grain protection layer and on the other hand, it avoids usage of Ag, Al and other metals which may incur electromigration as the reflection layer, thus improving the chip reliability.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip light emitting diode (LED), comprising:
   a substrate;
   a p-region metal portion and an n-region metal portion over a surface of the substrate and separated from each other;
   a p-type epitaxial layer, an active layer, and an n-type epitaxial layer successively laminated over the substrate;
   a reflection layer disposed between the substrate and the p-type epitaxial layer;
   a current blocking layer disposed between the reflection layer and the p-type epitaxial layer, and positioned so as to prevent current from concentrating on an edge of the LED;
   an insulating protection layer, cladding a side wall of the LED and exposing a portion of a side wall of the n-type epitaxial layer;
   a P electrode coupling the reflection layer and the p-region metal portion of the substrate; and
   an N electrode coupling the side wall of the n-type epitaxial layer and the n-region metal portion of the substrate.

2. The flip-chip LED of claim 1, wherein the N electrode is in contact the side wall of the n-type epitaxial layer and surrounds the LED.

3. The flip-chip LED of claim 1, wherein the reflection layer is a metal reflection layer and the current blocking layer has a band-shaped distribution along an edge of the reflection layer.

4. The flip-chip LED of claim 1, further comprising a current expansion layer in contact with both the p-type epitaxial layer and the P electrode, wherein the reflection layer is a DBR layer over the current expansion layer, and wherein the current blocking layer has a band-shaped distribution along an edge of the current expansion layer.

5. The flip-chip LED of claim 1, wherein the insulating protection layer is a DBR layer.

6. The flip-chip LED of claim 1, wherein the insulating protection layer covers a side wall of an interface between the n-type epitaxial layer and the active layer and a portion of the side wall of the n-type epitaxial layer, thereby avoiding direct contact between the N electrode and the active layer.

7. A light-emitting system including a plurality of flip-chip light emitting diodes (LEDs), each LED comprising:
   a substrate;
   a p-region metal portion and an n-region metal portion over a surface of the substrate and separated from each other;
   a p-type epitaxial layer, an active layer, and an n-type epitaxial layer successively laminated over the substrate;
   a reflection layer disposed between the substrate and the p-type epitaxial layer;
   a current blocking layer disposed between the reflection layer and the p-type epitaxial layer, and positioned so as to prevent current from concentrating on an edge of the LED;
   an insulating protection layer, cladding a side wall of the LED and exposing a portion of a side wall of the n-type epitaxial layer;
   a P electrode coupling the reflection layer and the p-region metal portion of the substrate; and
   an N electrode coupling the side wall of the n-type epitaxial layer and the n-region metal portion of the substrate.

8. The system of claim 7, wherein the N electrode is in contact the side wall of the n-type epitaxial layer and surrounds the LED.

9. The system of claim 7, wherein the reflection layer is a metal reflection layer and the current blocking layer has a band-shaped distribution along an edge of the reflection layer.

10. The system of claim 7, further comprising a current expansion layer in contact with both the p-type epitaxial layer and the P electrode, wherein the reflection layer is a DBR layer over the current expansion layer, and wherein the current blocking layer has a band-shaped distribution along an edge of the current expansion layer.

11. The system of claim 10, wherein the current blocking layer has a closed ring shape.

12. The system of claim 7, wherein the insulating protection layer is a DBR layer.

13. The system of claim 7, wherein the insulating protection layer covers a side wall of an interface between the n-type epitaxial layer and the active layer and a portion of the side wall of the n-type epitaxial layer, thereby avoiding direct contact between the N electrode and the active layer.

\* \* \* \* \*